United States Patent
Warnes et al.

(10) Patent No.: US 10,068,661 B2
(45) Date of Patent: Sep. 4, 2018

(54) POST PACKAGE REPAIR (PPR) DATA IN NON-VOLATILE MEMORY

(71) Applicant: HEWLETT PACKARD ENTERPRISE DEVELOPMENT LP, Houston, TX (US)

(72) Inventors: Lidia Warnes, Roseville, CA (US); Melvin K Benedict, Magnolia, TX (US); Andrew C Walton, Rocklin, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/913,916

(22) Filed: Mar. 6, 2018

(65) Prior Publication Data

US 2018/0204631 A1    Jul. 19, 2018

Related U.S. Application Data

(62) Division of application No. 15/313,751, filed as application No. PCT/US2014/044354 on Jun. 26, 2014, now Pat. No. 9,941,023.

(51) Int. Cl.
  *G11C 29/00*  (2006.01)
  *G11C 14/00*  (2006.01)
  *G11C 5/14*   (2006.01)

(52) U.S. Cl.
  CPC .............. *G11C 29/70* (2013.01); *G11C 5/148* (2013.01); *G11C 14/0018* (2013.01); *G11C 29/808* (2013.01)

(58) Field of Classification Search
  CPC .................................................. G11C 29/808

USPC .......................................................... 365/200
See application file for complete search history.

(56) References Cited

U.S. PATENT DOCUMENTS

| | | | | |
|---|---|---|---|---|
| 5,469,390 A | * | 11/1995 | Sasaki .................. | G11C 29/808 365/200 |
| 6,141,267 A | * | 10/2000 | Kirihata .................. | G11C 5/02 365/185.09 |
| 6,154,851 A | * | 11/2000 | Sher ........................ | G11C 29/72 714/5.11 |
| 6,282,689 B1 | * | 8/2001 | Seyyedy ............. | G06F 11/1044 714/773 |
| 6,704,228 B2 | | 3/2004 | Jang et al. | |
| 7,263,019 B2 | * | 8/2007 | Nierle ...................... | G11C 5/04 365/221 |
| 7,441,060 B2 | * | 10/2008 | Gower ................ | G06F 13/4243 365/201 |
| 7,839,707 B2 | * | 11/2010 | Aakjer ................. | G11C 17/165 365/200 |

(Continued)

OTHER PUBLICATIONS

International Searching Authority, The International Search Report and the Written Opinion, dated Apr. 15, 2015, 12 Pages.

(Continued)

*Primary Examiner* — Son Mai
(74) *Attorney, Agent, or Firm* — Hewlett Packard Enterprise Patent Department

(57) ABSTRACT

Example implementations relate to post package repair (PPR) data in non-volatile memory. In example implementations, PPR data may be stored in non-volatile memory on a memory module. PPR data may indicate how many PPRs have been performed on the memory module.

10 Claims, 7 Drawing Sheets

(56) References Cited

U.S. PATENT DOCUMENTS

| | | | |
|---|---|---|---|
| 7,948,818 B1 * | 5/2011 | Wu | G06F 11/073 |
| | | | 365/200 |
| 7,996,710 B2 | 8/2011 | Nagaraj et al. | |
| 9,087,615 B2 * | 7/2015 | Cordero | G11C 29/50012 |
| 9,165,679 B2 * | 10/2015 | Oh | G11C 29/785 |
| 2007/0058470 A1 * | 3/2007 | Nierle | G11C 5/04 |
| | | | 365/221 |
| 2007/0133323 A1 | 6/2007 | Kim et al. | |
| 2009/0217093 A1 | 8/2009 | Co | |
| 2011/0228614 A1 * | 9/2011 | Shaeffer | G11C 5/025 |
| | | | 365/189.04 |
| 2011/0296258 A1 | 12/2011 | Schechter et al. | |
| 2013/0176768 A1 | 7/2013 | Wang | |
| 2014/0003173 A1 | 1/2014 | Ku | |
| 2014/0078842 A1 | 3/2014 | Oh et al. | |
| 2016/0350191 A1 * | 12/2016 | Chen | G06F 11/2046 |

OTHER PUBLICATIONS

Lu, S-K. et al., Efficient Built-in Redundancy Analysis for Embedded Memories with 2-D Redundancy, (Research Paper), May 10, 2005, 5 Pages.

Wada, O. et al., Post-packaging Auto Repair Techniques for Fast Row Cycle Embedded DRAM, (Research Paper), Jul. 16, 2004, 8 Pages.

* cited by examiner

POST PACKAGE REPAIR (PPR) DATA IN NON-VOLATILE MEMORY

BACKGROUND

A memory module may have multiple memory devices. Error correction logic may be used to correct errors detected in memory devices. A memory module may include extra memory cells so that when memory cells of a memory device on the memory module malfunction, extra memory cells may be used instead of the entire memory module having to be replaced.

BRIEF DESCRIPTION OF THE DRAWINGS

The following detailed description references the drawings, wherein.

DETAILED DESCRIPTION

Memory cells in memory devices may fail to properly store data, for example as a result of a manufacturing defect or due to environmental conditions as memory devices are used. A manufacturer of memory modules may fabricate redundant memory cells that may be used to replace defective memory cells in memory devices. Such redundant memory cells may be referred to herein as "repair units". Repair units may include, for example, spare rows, spare columns, and/or spare single cells. The process of replacing a defective memory cell or cells with a repair unit after a memory device is packaged may be referred to herein as "post package repair", or "PPR".

Each volatile memory device on a memory module may track availability of its own repair units. A memory controller that is unaware of how many repair units are available to a volatile memory device may not know if a PPR is possible on the volatile memory device until the memory controller sends a PPR command and receives either a notification that the PPR is complete, or that an attempt to perform the PPR has failed. A failed attempt to perform a PPR may waste time and resources of a memory controller as well as of a memory module.

In light of the above, the present disclosure provides for storing PPR data in a non-volatile memory on a memory module. As used herein, the term "PPR data" refers to data related to the ability to perform PPRs, or to the effects of PPRs. PPR data may include, for example, how many repair units are available on a memory module and how many PPRs have been performed on a memory module. The storing of PPR data in a non-volatile memory on a memory module may allow a memory controller to use resources more efficiently when initiating PPRs, and allow PPR data to be tracked at a system level rather than at an individual volatile memory device level. In addition, multiple PPRs performed on the same volatile memory device may be tracked, and persistent PPR data in a non-volatile memory may allow PPRs and repair unit availability to be tracked across reboots of a memory module without expending system resources to discover/recreate such information during each boot time.

Figure 1:
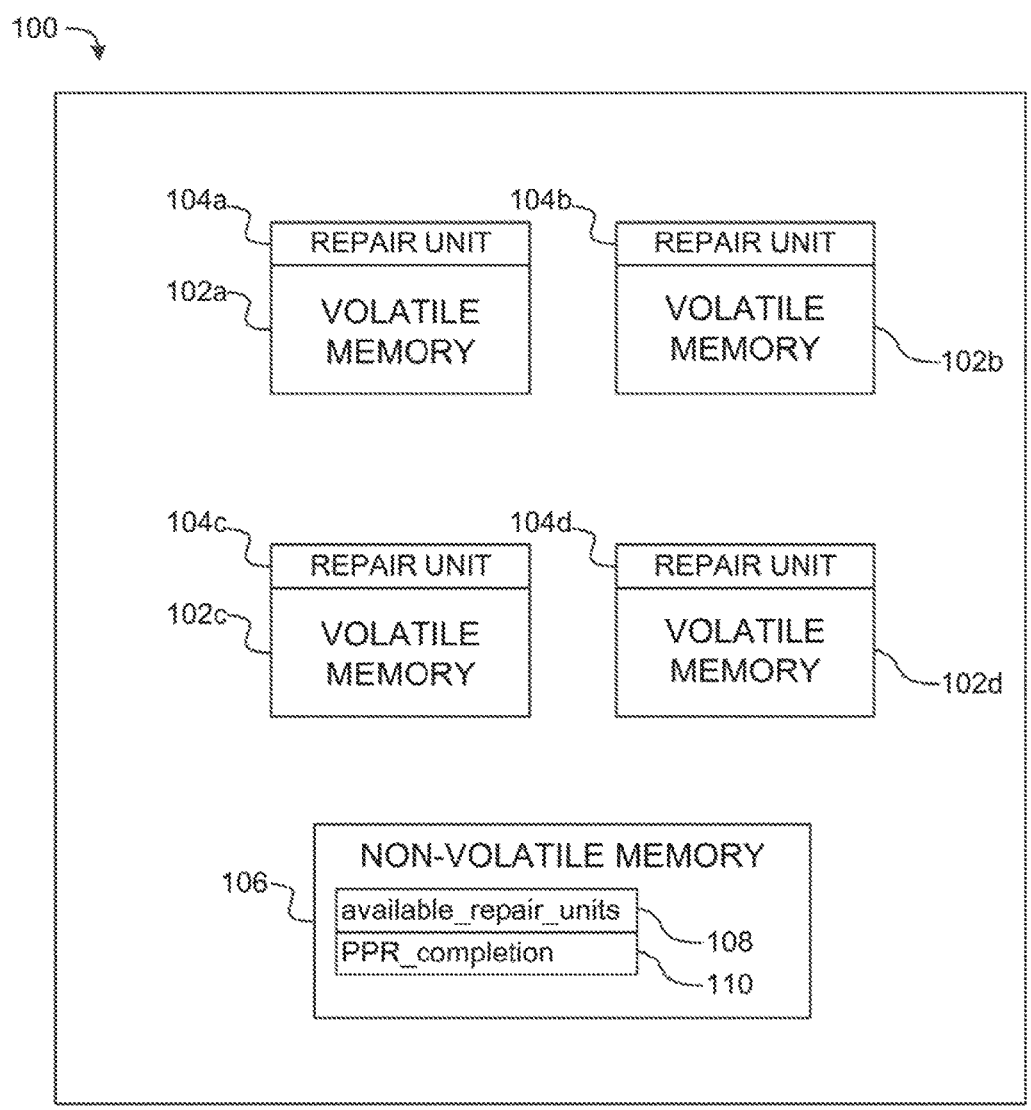
FIG. 1 is a block diagram of an example memory module that includes a non-volatile memory having post package repair (PPR) data.

Referring now to the figures, FIG. 1 is a block diagram of an example memory module 100 that includes a non-volatile memory having PPR data. Memory module 100 may be an in-line memory module, such as a single in-line memory module (SIMM) or a dual in-line memory module (DIMM), or any memory module suitable for mounting memory integrated circuits (ICs). In FIG. 1, memory module 100 includes volatile memory devices 102a, 102b, 102c, and 102d; repair units 104a, 104b, 104c, and 104d; and non-volatile memory 106. As used herein, the terms "include", "have", and "comprise" are interchangeable and should be understood to have the same meaning.

Volatile memory devices 102a-d may be on ICs on memory module 100. In some implementations, volatile memory devices 102a-d may be dynamic random-access memory (DRAM) devices. Although four volatile memory devices are shown in FIG. 1, it should be understood that memory module 100 may include more volatile memory devices or less volatile memory devices, and that the concepts discussed herein may be applicable to a memory module having any number of volatile memory devices.

Repair units 104a-d on memory module 100 may be used to replace defective portions of volatile memory devices 102a-d during PPRs. In some implementations, repair unit 104a may be used to replace a memory cell or cells in volatile memory device 102a. Similarly, repair units 104b, 104c, and 104d may be used to replace memory cells in volatile memory devices 102b, 102c, and 102d, respectively. In some implementations, any of repair units 104a-d may be used to replace memory cells in any of volatile memory devices 102a-d. In some implementations, repair units 104a, 104b, 104c, and 104d may be embedded in volatile memory devices 102a, 102b, 102c, and 102d, respectively. Although four repair units are shown in FIG. 1, it should be understood that memory module 100 may include more repair units or less repair units, and that the concepts discussed herein may be applicable to a memory module having any number of repair units.

In some implementations, repair units 104a-d may include repair units of a first type and repair units of a second type. For example, repair units 104a and 104b may be spare rows, and repair units 104c and 104d may be spare columns or spare single cells. In some implementations, a volatile memory device on memory module 100 may have multiple repair units, either of the same type or of different types. For example, volatile memory 102a may have five spare rows, or five repair units made up of a combination of spare rows, spare columns, and spare single cells.

Non-volatile memory 106 may store data about volatile memory devices 102a-d and any other volatile memory devices on memory module 100. In some implementations, non-volatile memory 106 may include a serial presence detect (SPD) electrically erasable programmable read-only memory (EEPROM). An SPD EEPROM on a memory module may store SPD data, such as memory timings and/or identifications of memory types on the memory module. Non-volatile memory 106 may include available repair units field 108 and PPR completion field 110. In some implementations, a non-volatile memory on a memory module may include a plurality of available repair units fields and a plurality of PPR completion fields, as discussed further below with respect to FIG. 2.

Available repair units field 108 may indicate how many of the repair units (e.g., repair units 104a-d) on memory module 100 are available for performing PPR on volatile memory devices (e.g., volatile memory devices 102a-d) on memory module 100. A repair unit may be available for performing PPR if the repair unit has not already been used (e.g., in a previous PPR) to replace a memory cell or cells in a volatile memory device. For example, if memory module 100 has four repair units (e.g., repair units 104a-d) and none of them have been used in a PPR, available repair units field 108 may have a value of 4. After one of the four repair units (e.g., repair unit 104b) has been used in a PPR, available repair units field 108 may have a value of 3.

PPR completion field 110 may indicate how many PPRs have been performed on volatile memory devices (e.g., volatile memory devices 102a-d) on memory module 100. For example, if memory module 100 has four volatile memory devices 102a-d and no PPR has been performed on any of them, PPR completion field 110 may have a value of 0. After a first PPR has been performed on volatile memory device 102b and a second PPR has been performed on volatile memory device 102d, PPR completion field 110 may have a value of 2.

Available repair units field 108 and PPR completion field 110 may be read by a memory controller during boot time of memory module 100. In some implementations, available repair units field 108 and PPR completion field 110 may be in an SPD EEPROM on memory module 100, and a memory controller may read these fields along with SPD data (e.g., timing information) in the SPD EEPROM during boot time of memory module 100. For example, the memory controller may read available repair units field 108 to determine whether a PPR can be performed during boot time of memory module 100. In some implementations, the memory controller may use data in available repair units field 108 and PPR completion field 110 to initialize counters on the memory controller, as discussed below with respect to FIG. 5. In some implementations, a Basic Input/Output System (BIOS), or other firmware stored as machine-readable instructions, may read and/or update available repair units field 108 and PPR completion field 110 in an SPD EEPROM, and use values in such fields to determine whether a PPR should be performed, as discussed below with respect to FIG. 6.

In some implementations, available repair units field 108 and PPR completion field 110 may be updated by a memory controller when memory module 100 is rebooted or in response to a command to power down memory module 100. For example, the memory controller may maintain counters during runtime of memory module 100 to keep track of how many PPRs are performed and how many repair units are used on memory module 100. When a command is issued to reboot or power down memory module 100, the memory controller may write a counter value, indicating how many repair units are still available on memory module 100, to available repair units field 108. The memory controller may write a counter value, indicating how many PPRs have been performed on memory module 100, to PPR completion field 110. Thus, non-volatile memory 106 on memory module 100 may have up-to-date information about repair unit availability and number of PPRs performed at the beginning of the next runtime of memory module 100.

Figure 2:
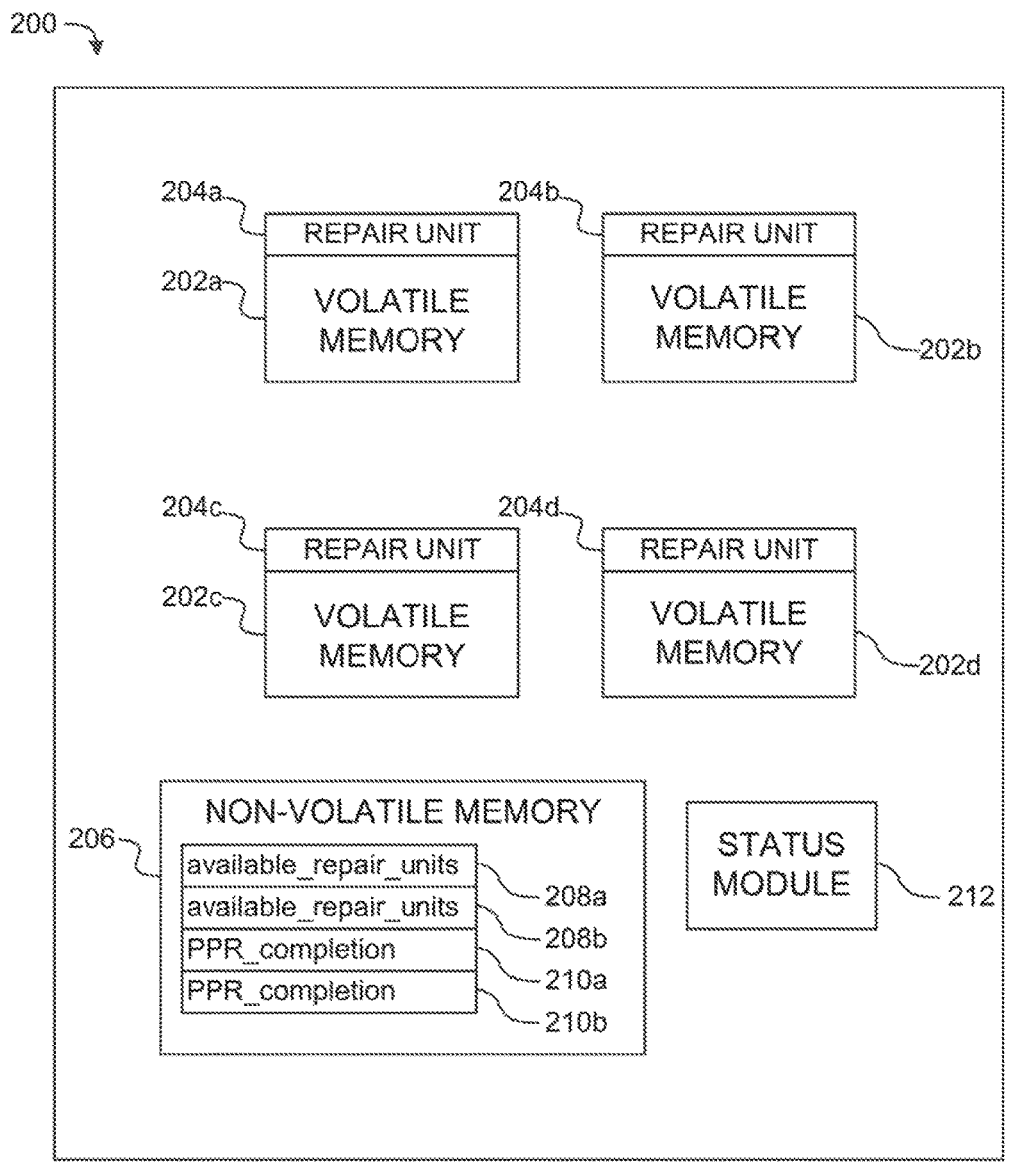
FIG. 2 is a block diagram of an example memory module that includes a plurality of available repair units fields for tracking availability of different types of repair units.

FIG. 2 is a block diagram of an example memory module 200 that includes a plurality of available repair units fields for tracking availability of different types of repair units. Memory module 200 may be an in-line memory module, such as a SIMM or DIMM, or any memory module suitable for mounting memory ICs. In FIG. 2, memory module 200 includes volatile memory devices 202a, 202b. 202c, and 202d; repair units 204a, 204b. 204c, and 204d; and non-volatile memory 206. Volatile memory devices 202a-d in FIG. 2 may be analogous to (e.g., have functions and/or components similar to) volatile memory devices 102a-d, respectively, in FIG. 1.

Repair units 204a-d may include repair units of a first type and repair units of a second type. For example, repair units 204a and 204c may be spare columns, and repair units 204b and 204d may be spare rows. Memory module 200 may include additional repair units of the first and/or second types, and may also include other types of repair units (e.g., spare single cells).

Non-volatile memory 206 may include available repair units fields 208a and 208b, and PPR completion fields 210a and 210b. Available repair units fields 208a and 208b may indicate how many repair units of a first type and of a second type, respectively, are available for performing PPR on volatile memory devices (e.g., volatile memory devices 202a-d) on memory module 200. For example, memory module 200 may have four repair units 204a-d, with repair units 204a and 204c being spare columns, and repair units 204b and 204d being spare rows. Available repair units field 208a may indicate how many spare columns are available for performing PPR on volatile memory devices on memory module 200, and available repair units field 208b may indicate how many spare rows are available for performing PPR on volatile memory devices on memory module 200. If none of repair units 204a-d have been used in a PPR, available repair units field 208a may have a value of 2, and available repair units field 208b may have a value of 2. After one of the spare rows (e.g., repair unit 204b) has been used in a PPR, available repair units field 208a may have a value of 2, and available repair units field 208b may have a value of 1.

PPR completion fields 210a and 210b may indicate how many repair units of the first type and of the second type, respectively, have been used to perform PPRs on volatile memory devices (e.g., volatile memory devices 202a-d) on memory module 200. For example, PPR completion field 210a may indicate how many spare columns have been used to perform PPRs on memory module 200, and PPR completion field 210b may indicate how many spare rows have been used to perform PPRs on memory module 200. If memory module 200 has four volatile memory devices 202a-d and no PPR has been performed on any of them, PPR completion field 210a may have a value of 0, and PPR completion field 210b may also have a value of 0. After one of the spare rows (e.g., repair unit 204b) has been used in a PPR, PPR completion field 210a may have a value of 0, and PPR completion field 210b may have a value of 1.

In some implementations, available repair units fields 208a-b and PPR completion fields 210e-b may be updated by a memory controller when memory module 200 is rebooted or in response to a command to power down memory module 200, as discussed above with respect to FIG. 1. If a BIOS on a memory controller identifies a defective portion of a volatile memory device during boot time of memory module 200, a PPR may be performed on the volatile memory device using an appropriate repair unit (e.g., a spare column may be used to replace a defective column), and the BIOS may update an available repair unit field and a PPR completion field in non-volatile memory 206 accordingly. In some implementations, available repair units fields 208a-b and PPR completion fields 210a-b may be updated by a memory controller during runtime of memory module 200. For example, if a PPR that uses a spare row is initiated during runtime of memory module 200, the memory controller may update available repair unit field 208b and PPR completion field 210b later on during runtime, after the PPR has been completed.

In some implementations, memory module 200 may include status module 212. A module may include a set of instructions encoded on a machine-readable storage medium and executable by a processor of memory module 200. In addition or as an alternative, a module may include a hardware device comprising electronic circuitry for implementing the functionality described below.

Status module 212 may transmit, in response to a PPR query directed at one of volatile memory devices 202a-d, a status indication for the volatile memory device at which the PPR query is directed. As used herein, the term "PPR query" should be understood to refer to a query regarding a volatile memory device's ability to perform a PPR. The volatile memory device at which the PPR query is directed may be referred to herein as the "targeted volatile memory device". Status module 212 may transmit an indication of PPR availability, if there is no PPR being performed on the targeted volatile memory device, and a repair unit on memory module 200 is available for performing PPR on the targeted volatile memory device, when the PPR query is received by memory module 200. Status module 212 may transmit an in-progress indication, if a PPR is being performed on the targeted volatile memory device when the PPR query is received by memory module 200. Status module 212 may transmit an indication that no PPR is available, if none of the repair units on memory module 200 is available for performing PPR on the targeted volatile memory device when the PPR query is received by memory module 200.

Figure 3:
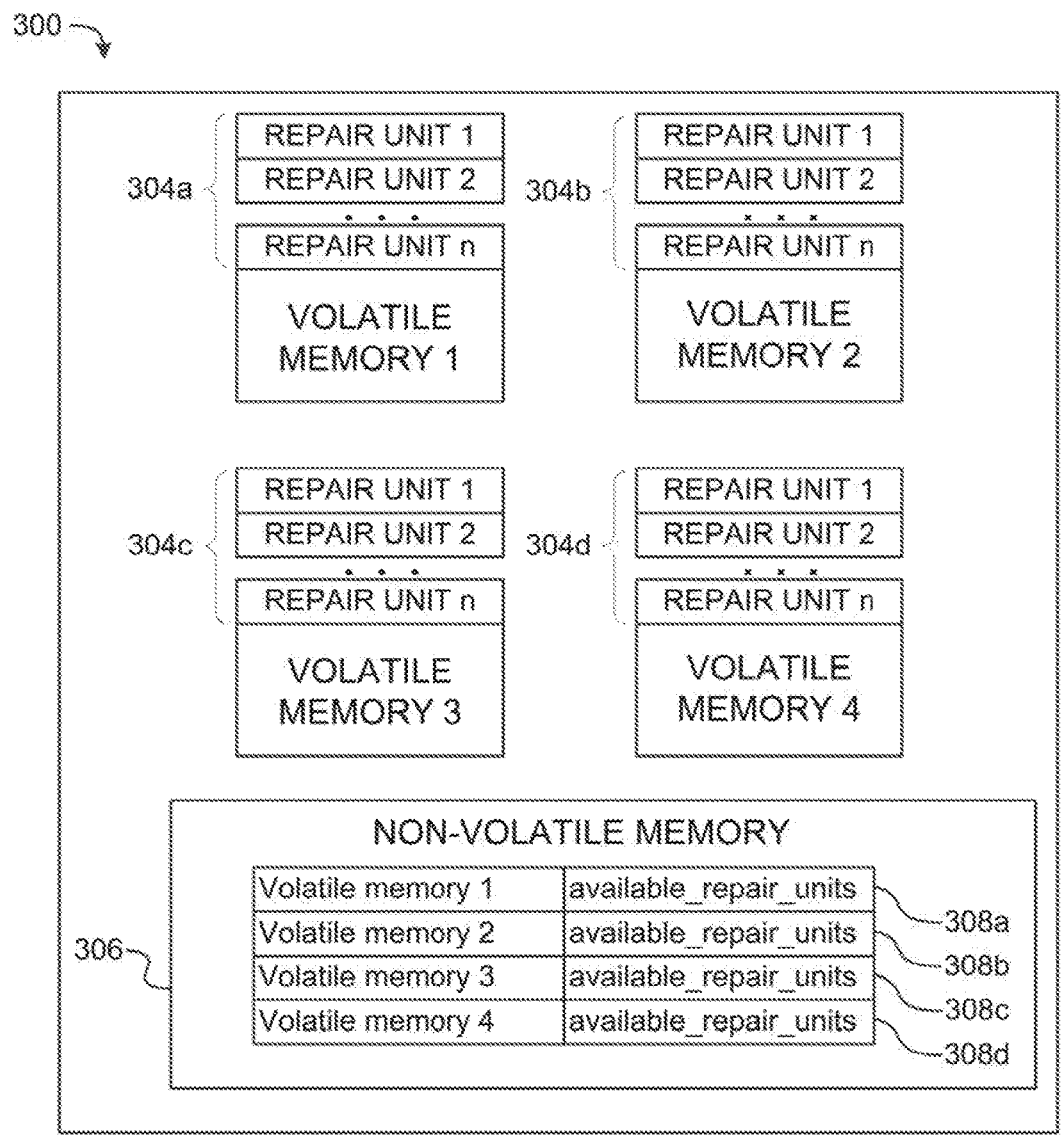
FIG. 3 is a block diagram of an example memory module that includes a plurality of available repair units fields for tracking availability of repair units on various volatile memory devices.

FIG. 3 is a block diagram of an example memory module 300 that includes a plurality of available repair units fields for tracking availability of repair units on various volatile memory devices. Memory module 300 may be an in-line memory module, such as a SIMM or DIMM, or any memory module suitable for mounting memory ICs. In FIG. 3, memory module 300 includes volatile memory devices 1, 2, 3, and 4, each of which may have a plurality of repair units (304a, 304b, 304c, and 304d, respectively) used to perform PPRs on the respective volatile memory device. Each of volatile memory devices 1-4 in FIG. 3 may be analogous to any of the volatile memory devices discussed above with respect to FIGS. 1 and 2. Each of the repair units in FIG. 3 may be analogous to any of the repair units discussed above with respect to FIGS. 1 and 2.

In FIG. 3, memory module 300 includes non-volatile memory 306, which may include available repair units fields 308a, 308b, 308c, and 308d. Available repair units fields 308a, 308b, 308c, and 308d may correspond to volatile memory devices 1, 2, 3, and 4, respectively. Each of available repair units fields 308a-d may indicate how many of a plurality of repair units on memory module 300 are available for performing PPR on the respective volatile memory device. For example, each of the plurality of repair units 304a-d may have five repair units. If none of the repair units on memory module 300 have been used to perform a PPR, each of available repair units fields 308a-d may have a value of 5. After a PPR is performed on volatile memory device 2 and three PPRs are performed on volatile memory device 3, available repair units fields 308a, 308b, 308c, and 308d may have a value of 5, 4, 2, and 5, respectively. Available repair units fields 308a-d may be read by a memory controller during boot time of memory module 300 to determine how many PPRs can be performed on each volatile memory device on memory module 300.

Figure 4:
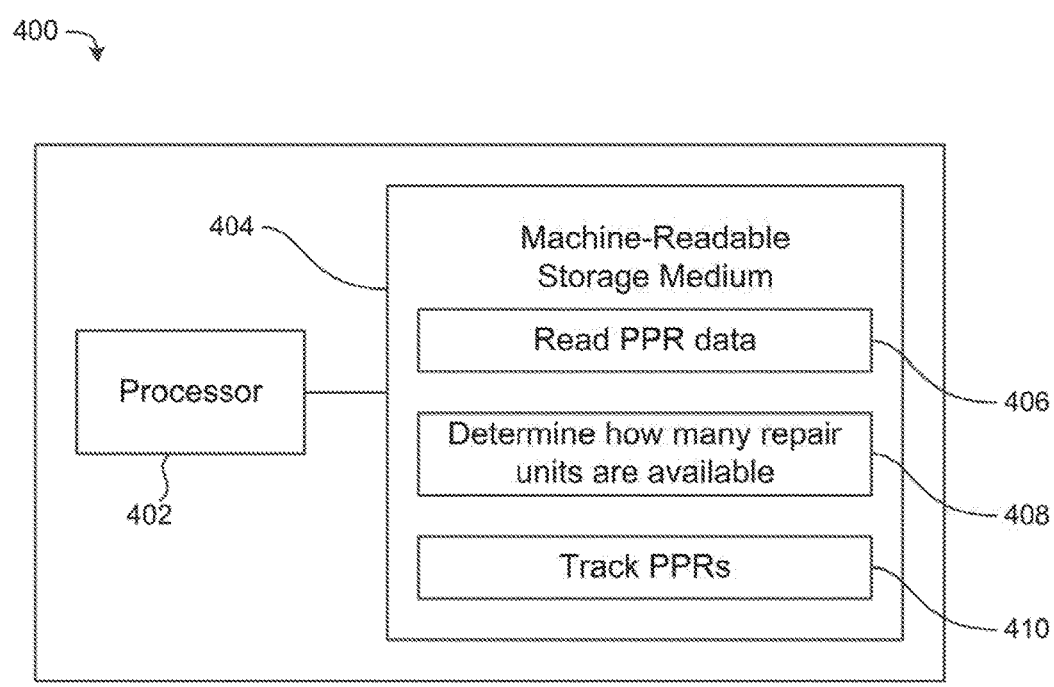
FIG. 4 is a block diagram of an example device that includes a machine-readable storage medium encoded with instructions to track PPRs performed on a memory module.

FIG. 4 is a block diagram of an example device 400 that includes a machine-readable storage medium encoded with instructions to track PPRs performed on a memory module. Device 400 may be a memory controller. In some implementations, device 400 may be part of an electronic user device, such as a notebook computer, a desktop computer, a workstation, a tablet computing device, a mobile phone, or an electronic book reader. In some implementations, device 400 may be part of a server. In FIG. 4, device 400 includes processor 402 and machine-readable storage medium 404.

Processor 402 may include a central processing unit (CPU), microprocessor (e.g., semiconductor-based microprocessor), and/or other hardware device suitable for retrieval and/or execution of instructions stored in machine-readable storage medium 404. Processor 402 may fetch, decode, and/or execute instructions 406, 408, and 410. As an alternative or in addition to retrieving and/or executing instructions, processor 402 may include an electronic circuit comprising a number of electronic components for performing the functionality of instructions 406, 408, and/or 410.

Machine-readable storage medium 404 may be any suitable electronic, magnetic, optical, or other physical storage device that contains or stores executable instructions. Thus, machine-readable storage medium 404 may include, for example, a random-access memory (RAM), an EEPROM, a storage device, an optical disc, and the like. In some implementations, machine-readable storage medium 404 may include a non-transitory storage medium, where the term "non-transitory" does not encompass transitory propagating signals. As described in detail below, machine-readable storage medium 404 may be encoded with a set of executable instructions 406, 408, and 410.

Instructions 406 may read PPR data, for a memory module, from non-volatile memory on the memory module. The PPR data for the memory module may include an indication of how many PPRs have been performed on the memory module. In some implementations, the PPR data may also include an indication of how many repair units are available for performing PPR on the memory module. In some implementations. PPR data for a memory module may include a manufacturer-provided indication, in non-volatile memory of the memory module, of how many repair units were fabricated on the memory module. Execution of instructions 406 may cause, for example, contents of non-volatile memory 106, 206, or 306 to be read. In some implementations, instructions 406 may be executed during boot time of a memory module. In some implementations, instructions 406 may be executed during runtime of a memory module.

Instructions 408 may determine, based on PPR data read from non-volatile memory on a memory module, how many repair units are available for performing PPR on the memory module. In some implementations, instructions 408 may identify indications, in the PPR data, of how many repair units are available. For example, instructions 406 may read available repair units field 108, and instructions 408 may identify the value in available repair units field 108. In some implementations. PPR data may be read that includes an indication of how many repair units the memory module has (e.g., how many repair units the memory module is manufactured with), and an indication of how many PPRs have been performed on the memory module. In such implementations, instructions 408 may determine how many repair units are available for performing PPR by subtracting the number of PPRs performed from the number of repair units the memory module has.

Instructions 410 may track PPRs performed on a memory module. For example, instructions 410 may increment a counter every time a repair unit is used to perform a PPR on the memory module. The counter may be incremented when a PPR completion indication is received from the memory module. In some implementations, instructions 410 may track PPRs performed on individual volatile memory devices on a memory module, maintaining a different counter for each volatile memory device. In some implementations, instructions 410 may track PPRs performed on multiple memory modules, maintaining a different counter for each memory module.

Figure 5:
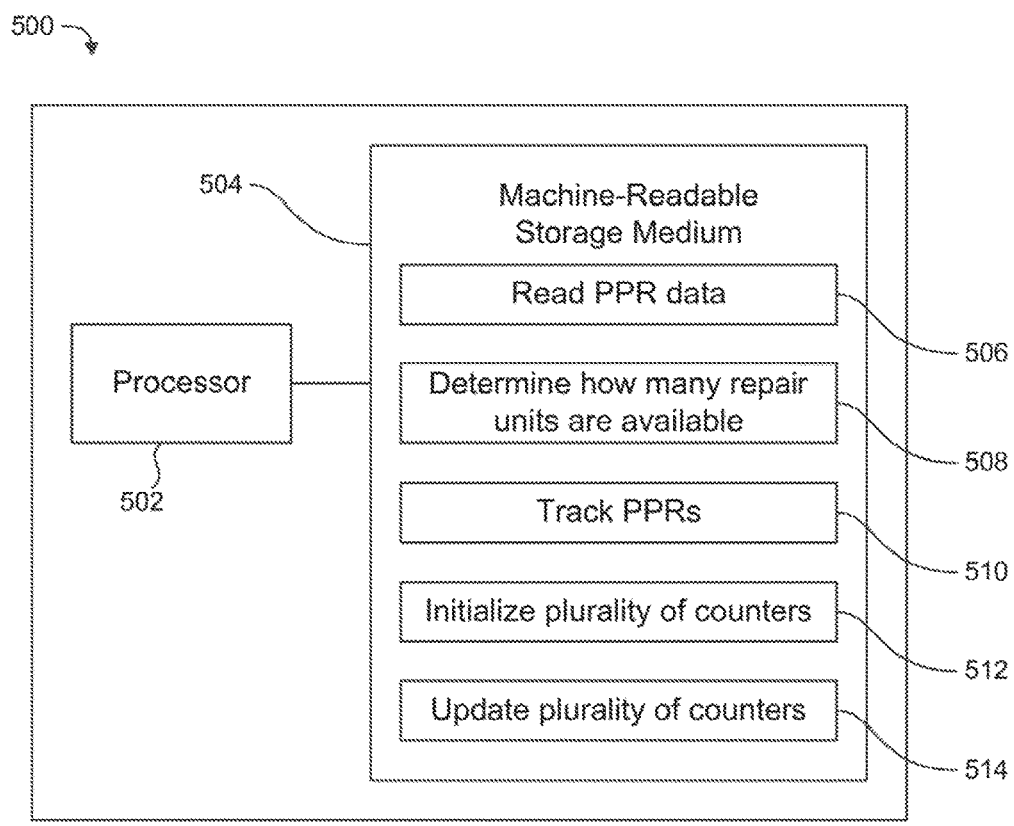
FIG. 5 is a block diagram of an example device that includes a machine-readable storage medium encoded with instructions to enable usage of a counter to track repair unit availability.

FIG. 5 is a block diagram of an example device 500 that includes a machine-readable storage medium encoded with instructions to enable usage of a counter to track repair unit availability. Device 500 may be a memory controller. In some implementations, device 500 may be part of an electronic user device, such as a notebook computer, a desktop computer, a workstation, a tablet computing device, a mobile phone, or an electronic book reader. In some implementations, device 500 may be part of a server. In FIG. 5, device 500 includes processor 502 and machine-readable storage medium 504.

As with processor 402 of FIG. 4, processor 502 may include a CPU, microprocessor (e.g., semiconductor-based microprocessor), and/or other hardware device suitable for retrieval and/or execution of instructions stored in machine-readable storage medium 504. Processor 502 may fetch, decode, and/or execute instructions 506, 508, 510, 512, and 514 to enable usage of a counter to track repair unit availability, as described below. As an alternative or in addition to retrieving and/or executing instructions, processor 502 may include an electronic circuit comprising a number of electronic components for performing the functionality of instructions 506, 508, 510, 512, and/or 514.

As with machine-readable storage medium 404 of FIG. 4, machine-readable storage medium 504 may be any suitable physical storage device that stores executable instructions. Instructions 506, 508, and 510 on machine-readable storage medium 504 may be analogous to instructions 406, 408, and 410 on machine-readable storage medium 404. Instructions 512 may initialize, based on PPR data read from non-volatile memory on a memory module, a plurality of counters. The plurality of counters may be initialized during boot time of the memory module. In some implementations, the plurality of counters may be stored in a data structure on a memory controller. The plurality of counters may include an available repair units counter and a PPR completion counter. The available repair units counter may track how many repair units are available for performing PPR on the memory module. The PPR completion counter may track how many PPRs have been performed on the memory module.

For example, execution of instructions 506 may cause available repair units field 108 and PPR completion field 110 to be read from non-volatile memory 106 of memory module 100. Instructions 512 may initialize an available repair units counter to have a value equal to the value of available repair units field 108. In some implementations, an available repair units counter for a memory module may be initialized with a value equal to the number of repair units manufactured on the memory module. Instructions 512 may initialize a PPR completion counter to have a value equal to the value of PPR completion field 110. In some implementations, a memory module from which PPR data is read may have repair units of different types. In such implementations, an available repair units field and a PPR completion field (e.g., available repair units fields 208a-b and PPR completion fields 210a-b of FIG. 2) may be read for each repair unit type, and instructions 512 may use the field values to initialize an available repair units counter and a PPR completion counter for each repair unit type. In some implementations, available repair units fields and PPR completion fields corresponding to various volatile memory devices on a memory module may be read from non-volatile memory on the memory module, and instructions 512 may use the field values to initialize an available repair units counter and a PPR completion counter for each volatile memory device.

Instructions 514 may update a plurality of counters as PPRs are performed on a memory module. For example, instructions 514 may include instructions to decrement an available repair units counter, and increment a PPR completion counter, in response to receiving a PPR completion indication or an in-progress indication. The PPR completion indication or in-progress indication may be received in response to a PPR query issued by a memory controller to a volatile memory device on a memory module. If different counters are maintained for different volatile memory devices and/or repair unit types, instructions 514 may increment/decrement the appropriate counters based on information in the PPR completion/in-progress indication, and/or information in the PPR query in response to which the PPR completion/in-progress indication was received, that identifies the targeted volatile memory device and/or the repair unit type used in the PPR corresponding to the PPR completion/In-progress indication.

In some implementations, a PPR may be performed on a volatile memory device on a memory module without a command to perform a PPR being issued by a memory controller. Since the memory controller did not issue a command for the PPR that is performed, the memory controller may not receive a PPR completion indication when the PPR is completed, and an available repair units counter maintained by the memory controller may not be decremented after the PPR is completed, even though there is one less repair unit available after the PPR is completed. A situation may arise where there are no more repair units available for PPR even though an available repair units counter maintained by the memory controller has a non-zero value. Thus, instructions 514 may include instructions to set an available repair units counter to zero in response to receiving an indication that no PPR is available.

Figure 6:
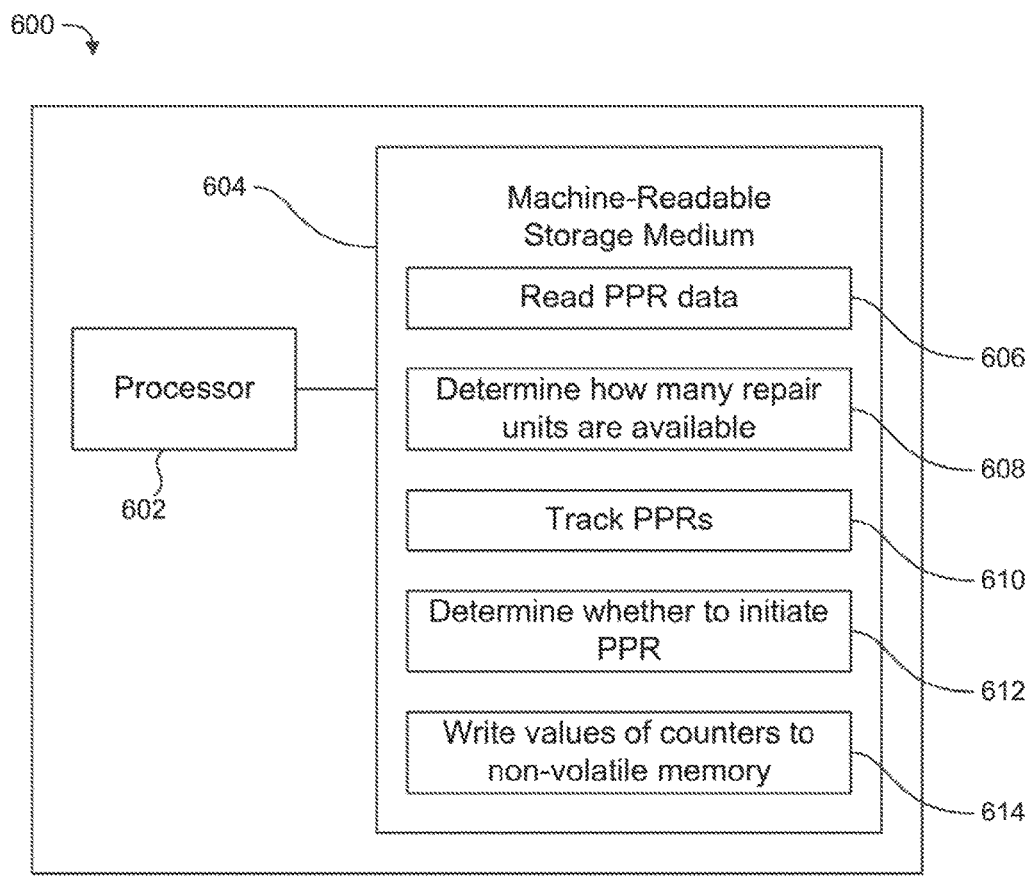
FIG. 6 is a block diagram of an example device that includes a machine-readable storage medium encoded with instructions to determine, based on a counter value, whether to initiate a PPR.

FIG. 6 is a block diagram of an example device 600 that includes a machine-readable storage medium encoded with instructions to determine, based on a counter value, whether to initiate a PPR. In some implementations, device 600 may be part of an electronic user device, such as a notebook computer, a desktop computer, a workstation, a tablet computing device, a mobile phone, or an electronic book reader. In some implementations, device 600 may be part of a server. In some implementations, device 600 may be implemented on a server. In FIG. 6, device 600 includes processor 602 and machine-readable storage medium 604.

As with processor 402 of FIG. 4, processor 602 may include a CPU, microprocessor (e.g., semiconductor-based microprocessor), and/or other hardware device suitable for retrieval and/or execution of instructions stored in machine-readable storage medium 604. Processor 602 may fetch, decode, and/or execute instructions 606, 608, 610, 612, and 614. As an alternative or in addition to retrieving and/or executing instructions, processor 602 may include an electronic circuit comprising a number of electronic components for performing the functionality of instructions 606, 608, 610, 612, and/or 614.

As with machine-readable storage medium 404 of FIG. 4, machine-readable storage medium 604 may be any suitable physical storage device that stores executable instructions. Instructions 606, 608, and 610 on machine-readable storage medium 604 may be analogous to instructions 406, 408, and 410 on machine-readable storage medium 404. Instructions 612 may determine, based on a value of one of a plurality of counters, whether to initiate a PPR on a memory module. For example, instructions 612 may identify a pattern of corrected memory errors or a number of repeated error interrupts as a situation for which a PPR is appropriate. In some implementations, instructions 612 may determine that a PPR is to be initiated if the value of an available repair units counter is greater than zero, and that a PPR is not to be initiated if the value of the available repair units counter is equal to zero. The available repair units counter may correspond to a memory module or a specific volatile memory device on which a defective memory cell or cells are identified. A PPR may be initiated during boot time or runtime of a memory module.

In some implementations, instructions 612 may determine that a PPR is to be initiated if the value of a PPR completion counter is less than the number of repair units on a memory module or a specific volatile memory device corresponding to the PPR completion counter. Instructions 612 may determine that a PPR is not to be initiated if the value of the PPR completion counter is equal to or greater than the number of repair units on the memory module or specific volatile memory device. The relevant memory module or specific volatile memory device may be one on which a defective memory cell or cells are identified. If it is determined that a PPR is not to be initiated, a memory controller may use methods such as memory erasure or double device data correction (DDDC) to correct errors caused by the defective memory cell(s), or may request a service call.

Instructions 614 may write respective values of an available repair units counter and a PPR completion counter to a non-volatile memory on a memory module. In some implementations, the counters may be incremented/decremented each time a PPR is completed, and the new values of the counters may be written to the non-volatile memory after each PPR is completed. Counter values may be written to the non-volatile memory during boot time and/or runtime of the memory module. In some implementations, counters may be incremented/decremented each time a PPR is completed during runtime of the memory module, but the counter values might not be written to the non-volatile memory until a command to reboot or power down the memory module is issued. In some implementations, the counters may be stored in a data structure on a memory controller.

Figure 7:
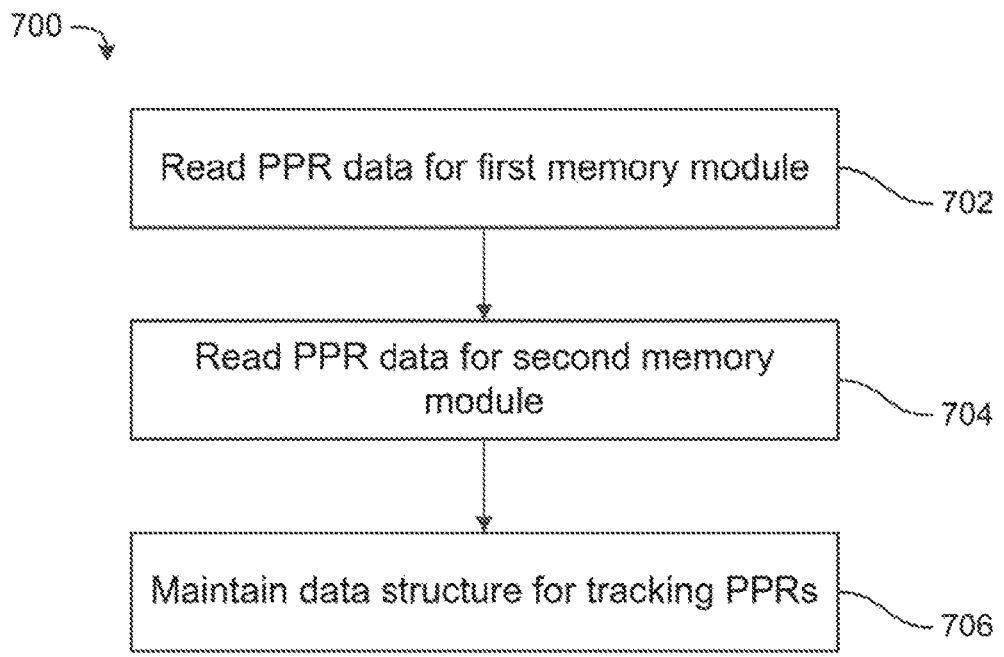
FIG. 7 is a flowchart of an example method for tracking PPRs.
Figure 8:
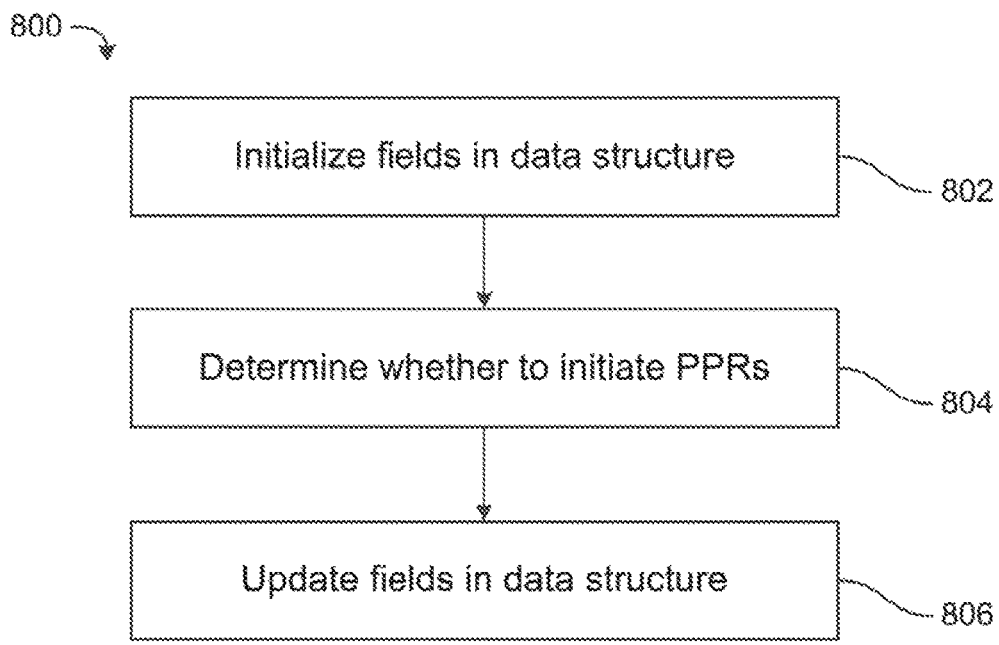
FIG. 8 is a flowchart of an example method for maintaining a data structure for PPR data.

Methods related to storing PPR data in non-volatile memory are discussed with respect to FIGS. 7-8. FIG. 7 is a flowchart of an example method 700 for tracking PPRs. Although execution of method 700 is described below with reference to processor 502 of FIG. 5, it should be understood that execution of method 700 may be performed by other suitable devices, such as processors 402 and 602 of FIGS. 4 and 6, respectively. Method 700 may be implemented in the form of executable instructions stored on a machine-readable storage medium and/or in the form of electronic circuitry.

Method 700 may start in block 702, where processor 502 may read PPR data, for a first memory module, from non-volatile memory on the first memory module. The PPR data for the first memory module may include an indication of how many PPRs have been performed on the first memory module. For example, the PPR data for the first memory module may include a value of a PPR completion field in non-volatile memory on the first memory module. In some implementations, PPR data for the first memory module may be read, during boot time of the first memory module, from an SPD EEPROM on the first memory module.

In block 704, processor 502 may read PPR data, for a second memory module, from non-volatile memory on the second memory module. The PPR data for the second memory module may include an indication of how many PPRs have been performed on the second memory module. For example, the PPR data for the second memory module may include a value of a PPR completion field in non-volatile memory on the second memory module. In some implementations, PPR data for the second memory module may be read, during boot time of the second memory module, from an SPD EEPROM on the second memory module. Although block 704 is shown below block 702 in FIG. 7, it should be understood that elements of block 704 may be performed before or in parallel with elements of block 702.

In block 706, processor 502 may maintain a data structure for tracking PPRs performed on the first and second memory modules. Fields of the data structure may be initialized using the indications, read from non-volatile memory on the first and second memory modules, of how many PPRs have been performed on the first and second memory modules, respectively. In some implementations, the data structure may include a first available repair units field, a second available repair units field, a third available repair units field, and a fourth available repair units field. The first and second available repair units fields may indicate how many repair units of a first type and of a second type, respectively, are available for performing PPR on the first memory module. The third and fourth available repair units fields may indicate how many repair units of the first type and of the second type, respectively, are available for performing PPR on the second memory module.

In some implementations, the data structure may include a first PPR completion field, a second PPR completion field, a third PPR completion field, and a fourth PPR completion field. The first and second PPR completion fields may indicate how many repair units of the first type and of the second type, respectively, have been used to perform PPRs on the first memory module. The third and fourth PPR completion fields may indicate how many repair units of the first type and of the second type, respectively, have been used to perform PPRs on the second memory module. In some implementations, fields of the data structure may correspond to counters maintained by a memory controller, as discussed above with respect to FIGS. 5-6.

FIG. 8 is a flowchart of an example method 800 for maintaining a data structure for PPR data. Although execution of method 800 is described below with reference to processor 602 of FIG. 6, it should be understood that execution of method 800 may be performed by other suitable devices, such as processors 402 and 502 of FIGS. 4 and 5, respectively. Some blocks of method 800 may be performed in parallel with and/or after method 700. Method 800 may be implemented in the form of executable instructions stored on a machine-readable storage medium and/or in the form of electronic circuitry.

Method 800 may start in block 802, where processor 602 may initialize fields of a data structure for tracking PPRs. Fields of the data structure may include available repair units fields and PPR completion fields, as discussed above with respect to FIG. 7. Fields of the data structure may be initialized in a manner analogous to that of initializing counters, as discussed above with respect to FIG. 5. Fields of the data structure may be initialized during boot time of a memory module.

In block 804, processor 602 may determine, based on values of fields in the data structure, whether to initiate PPRs on the first and second memory modules. In some implementations, processor 602 may determine that a PPR is to be initiated if the value of an available repair units field in the data structure is greater than zero, and that a PPR is not to be initiated if the value of the available repair units field is equal to zero. A first available repair units field may correspond to the first memory module, and a second available repair units field may correspond to the second memory module; a decision may be made regarding whether to initiate a PPR on the first or second memory module based on the value of the respective available repair units field.

In block 806, processor 602 may update fields in the data structure in response to status indications and PPR completion indications. Fields in the data structure may be updated in a manner analogous to that of updating counters, as discussed above with respect to FIG. 5. Although block 806 is shown below block 804 in FIG. 8, it should be understood that elements of block 806 may be performed before or in parallel with elements of block 804.

The foregoing disclosure describes storing PPR data in a non-volatile memory on a memory module. Example implementations described herein enable more efficient use of resources when initiating and tracking PPRs, and tracking of PPR data at a system level rather than at an individual volatile memory device level.

We claim:

1. A memory module comprising:
a plurality of volatile memory devices;
a plurality of repair units; and
non-volatile memory to store data about the plurality of volatile memory devices, wherein the non-volatile memory comprises:
an available repair units field to indicate how many of the plurality of repair units are available for performing post package repair (PPR) on the plurality of volatile memory devices; and
a PPR completion field to indicate how many PPRs have been performed on the plurality of volatile memory devices;
wherein the available repair units field and the PPR completion field are to be read by a memory controller during boot time of the memory module.

2. The memory module of claim 1, wherein the non-volatile memory comprises a serial presence detect (SPD) electrically erasable programmable read-only memory (EEPROM).

3. The memory module of claim 1, wherein:
the plurality of repair units comprise repair units of a first type and repair units of a second type;
the non-volatile memory comprises a plurality of available repair units fields and a plurality of PPR completion fields;
the plurality of available repair units fields comprise a first available repair units field and a second available repair units field to indicate how many repair units of the first type and of the second type, respectively, are available for performing PPR on the plurality of volatile memory devices; and
the plurality of PPR completion fields comprise a first PPR completion field and a second PPR completion field to indicate how many repair units of the first type and of the second type, respectively, have been used to perform PPRs on the plurality of volatile memory devices.

4. The memory module of claim 1, wherein the available repair units field and the PPR completion field are updated by the memory controller when the memory module is rebooted or in response to a command to power down the memory module.

5. The memory module of claim 1, further comprising a status module to transmit, in response to a PPR query directed at one of the plurality of volatile memory devices:
an indication of PPR availability, if there is no PPR being performed on the one of the plurality of volatile memory devices, and one of the plurality of repair units is available for performing PPR on the one of the plurality of volatile memory devices, when the PPR query is received by the memory module;
an in-progress indication, if a PPR is being performed on the one of the plurality of volatile memory devices when the PPR query is received by the memory module; and
an indication that no PPR is available, if none of the plurality of repair units is available for performing PPR on the one of the plurality of volatile memory devices when the PPR query is received by the memory module.

6. The memory module of claim 1, wherein the non-volatile memory comprises a plurality of available repair units fields, each of the plurality of available repair units fields corresponding to a respective one of the plurality of volatile memory devices and indicating how many of the plurality of repair units are available for performing PPR on the respective one of the plurality of volatile memory devices.

7. A method comprising:
reading post package repair (PPR) data, for a first memory module, from non-volatile memory on the first memory module, wherein the PPR data for the first memory module comprises an indication of how many PPRs have been performed on the first memory module;
reading PPR data, for a second memory module, from non-volatile memory on the second memory module, wherein the PPR data for the second memory module comprises an indication of how many PPRs have been performed on the second memory module;
maintaining a data structure for tracking PPRs performed on the first and second memory modules, wherein fields of the data structure are initialized using the indications, read from non-volatile memory on the first and second memory modules, of how many PPRs have been performed on the first and second memory modules, respectively.

8. The method of claim 7, wherein:

PPR data for the first memory module is read, during boot time of the first memory module, from a serial presence detect (SPD) electrically erasable programmable read-only memory (EEPROM) on the first memory module; and PPR data for the second memory module is read, during boot time of the second memory module, from an SPD EEPROM on the second memory module.

9. The method of claim 7, wherein the data structure for tracking PPRs comprises:

a first available repair units field and a second available repair units field to indicate how many repair units of a first type and of a second type, respectively, are available for performing PPR on the first memory module;

a third available repair units field and a fourth available repair units field to indicate how many repair units of the first type and of the second type, respectively, are available for performing PPR on the second memory module;

a first PPR completion field and a second PPR completion field to indicate how many repair units of the first type and of the second type, respectively, have been used to perform PPRs on the first memory module; and a third PPR completion field and a fourth PPR completion field to indicate how many repair units of the first type and of the second type, respectively, have been used to perform PPRs on the second memory module.

10. The method of claim 9, wherein maintaining the data structure comprises updating fields in the data structure in response to status indications and PPR completion indications, the method further comprising determining, based on values of fields in the data structure, whether to initiate PPRs on the first and second memory modules.

* * * * *